(12) United States Patent
Aurongzeb et al.

(10) Patent No.: US 11,349,103 B2
(45) Date of Patent: May 31, 2022

(54) DISPLAY ASSEMBLY APPARATUS AND METHODS FOR INFORMATION HANDLING SYSTEMS

(71) Applicant: DELL PRODUCTS L.P., Round Rock, TX (US)

(72) Inventors: Deeder Aurongzeb, Austin, TX (US); Stefan Peana, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 0 days.

(21) Appl. No.: 15/922,334

(22) Filed: Mar. 15, 2018

(65) Prior Publication Data
US 2019/0288241 A1 Sep. 19, 2019

(51) Int. Cl.
| | | |
|---|---|---|
| *H01L 27/32* | (2006.01) | |
| *H01L 51/56* | (2006.01) | |
| *H01L 51/52* | (2006.01) | |
| *H01L 33/02* | (2010.01) | |

(52) U.S. Cl.
CPC .............. *H01L 51/56* (2013.01); *H01L 27/32* (2013.01); *H01L 33/02* (2013.01); *H01L 51/529* (2013.01); *H01L 51/5246* (2013.01)

(58) Field of Classification Search
CPC ... H01L 51/56; H01L 51/5246; H01L 51/529; H01L 33/02; H01L 27/32
See application file for complete search history.

(56) References Cited

U.S. PATENT DOCUMENTS

| | | |
|---|---|---|
| 6,683,665 B1 * | 1/2004 | Matthies .............. G02F 1/1309 349/187 |
| 8,115,698 B2 | 2/2012 | Azor et al. |
| 8,232,350 B2 | 7/2012 | Fujita et al. |
| 8,506,085 B2 | 8/2013 | Azor et al. |
| 9,309,443 B2 | 4/2016 | Yurt et al. |
| 9,631,126 B2 | 4/2017 | Lee et al. |
| 9,676,928 B2 | 6/2017 | Liu et al. |
| 9,760,122 B1 | 9/2017 | Aurongzeb et al. |
| 9,780,318 B2 | 10/2017 | Johnson et al. |
| 9,803,114 B2 | 10/2017 | Ha et al. |

(Continued)

OTHER PUBLICATIONS

Ong et al., "Display Device With Color and Luminance Characterization and Compensation Methods", DELL:217, Filed Mar. 28, 2017, U.S. Appl. No. 15/471,901, 41 pgs.

(Continued)

*Primary Examiner* — Hoa B Trinh
(74) *Attorney, Agent, or Firm* — Egan, Enders & Huston LLP

(57) ABSTRACT

Apparatus and methods may be implemented to provide multi-layer display assembly apparatus for information handling systems, including portable information handling systems (e.g., such as smart phones, tablet computers, notebook computers, etc.) as well as display assembly apparatus for other types of information handling systems such as desktop computers, servers, etc. The disclosed multi-layer display assembly apparatus may be implemented to include multiple adhesive layers (e.g., two or more adhesive layers) that have different indices of refraction and/or different debonding characteristics, and that are disposed between a display substrate and an transparent protective hardcover such as glass-based or plastic-based cover.

29 Claims, 6 Drawing Sheets

(56) References Cited

U.S. PATENT DOCUMENTS

| | | | |
|---|---|---|---|
| 9,837,020 B2 | 12/2017 | Knepper et al. | |
| 9,850,409 B2 | 12/2017 | Zhang et al. | |
| 2009/0026934 A1* | 1/2009 | Fujita | C09J 123/20 313/504 |
| 2010/0155247 A1* | 6/2010 | Cao | C08L 21/00 204/600 |
| 2011/0012852 A1* | 1/2011 | Takahashi | G06F 3/041 345/173 |
| 2011/0073901 A1* | 3/2011 | Fujita | C09J 7/24 257/100 |
| 2012/0139821 A1* | 6/2012 | Kim | H05B 33/00 345/76 |
| 2015/0036204 A1* | 2/2015 | Branda | G02F 1/0147 359/244 |
| 2019/0208044 A1* | 7/2019 | Lee | G06F 1/1684 |

OTHER PUBLICATIONS

Huang, "Touch Screen Display Device With Improved ESD Protection", DELL:214. Filed May 8, 2017, U.S. Appl. No. 15/589,468, 33 pgs.
Chen et al., "Touch Screen and Method of Compensating for Differences in Routing Trace Path Lengths", DELL:216, Filed Apr. 26, 2017, U.S. Appl. No. 15/498,035, 43 pgs.
3M Optically Clear Adhesives, Technical Data, Jul. 2008, 6 pgs.
3M Optically Clear Adhesives 8171-8172, Technical Data, Jul. 2008, 4 pgs.
3M Optically Clear Adhesive 9483, Technical Data. Sep. 2008, 4 pgs.
Locite, "Light Cure Adhesive Technology7 Guide". 2017, 24 pgs.
Zhu et al., "A Novel Transparent Glass Fiber-Reinforced Polymer Composite Interlayer for Blast Resistant Window's", J. Eng. Mater, Technology 138(3), May 2016, 3 pgs.
Plastics International, "Adhesive Bonding of Thermoplastic Materials", obtained from internet Mar. 11, 2018, 2 pgs.
Marotta, "Advancement in Light Cure Adhesive Technology", Henkel Corporation, obtained from internet Mar. 9, 2018, 7 pgs.
Clements, "Selection of Optical Adhesives", Dec. 14, 2006, 18 pgs.
Wikipedia, "Gorilla Glass", Printed From Internet Feb. 9, 2018, 5 pgs.
Corning, Gorilla Glass 5, Printed From Internet Feb. 9, 2018, 2 pgs.
NTT Advanced Technology Corporation, "High Refractive Index/ Low Refractive Index Resins", 2000, 5 pgs.
3M Light Cure Adhesive LC-1113, Technical Data, Dec. 2012, 4 pgs.
3M Light Cure Adhesive LC-1215, Technical Data, Dec. 2012, 2 pgs.
Wikipedia. "Refractive Index", Printed From Internet Feb. 12, 2018, 20 pgs.
Marotta, "Sticking to Light Cure Adhesives", 2009, 10 pgs.
PSI Urethanes, Inc., Thermoset Urethane vs. Thermoplastic Urethane, 2017, 4 pgs.
AI Technology, Inc., Thermally Conductive Thermoplastic Film Adhesive, Film TP71550c Mar. 24, 2004, 1 pg.
Scapa, Acrylic Adhesives, obtained from the internet Mar. 11, 2018, 4pgs.
whatis.com, Definition TOLED (transparent organic light-emitting device), Mar. 2011, 2 pgs.
Huang, "Touch Screen Display Device With Improved ESD Protection", U.S. Appl. No. 15/589,468, filed May 8, 17, DELL-214, 33 pgs.
Chen et al., "Touch Screen and Method of Compensating for Difference in Routing Trace Path Lengths", U.S. Appl. No. 15/498,035, filed Apr. 26, 17, DELL-216,43 pgs.
Ong et al., "Display Device with Color and Luminance Characterization and Compensation Methods", U.S. Appl. No. 15/471,901 filed Mar. 28, 2017, DELL-217, 41 pgs.

* cited by examiner

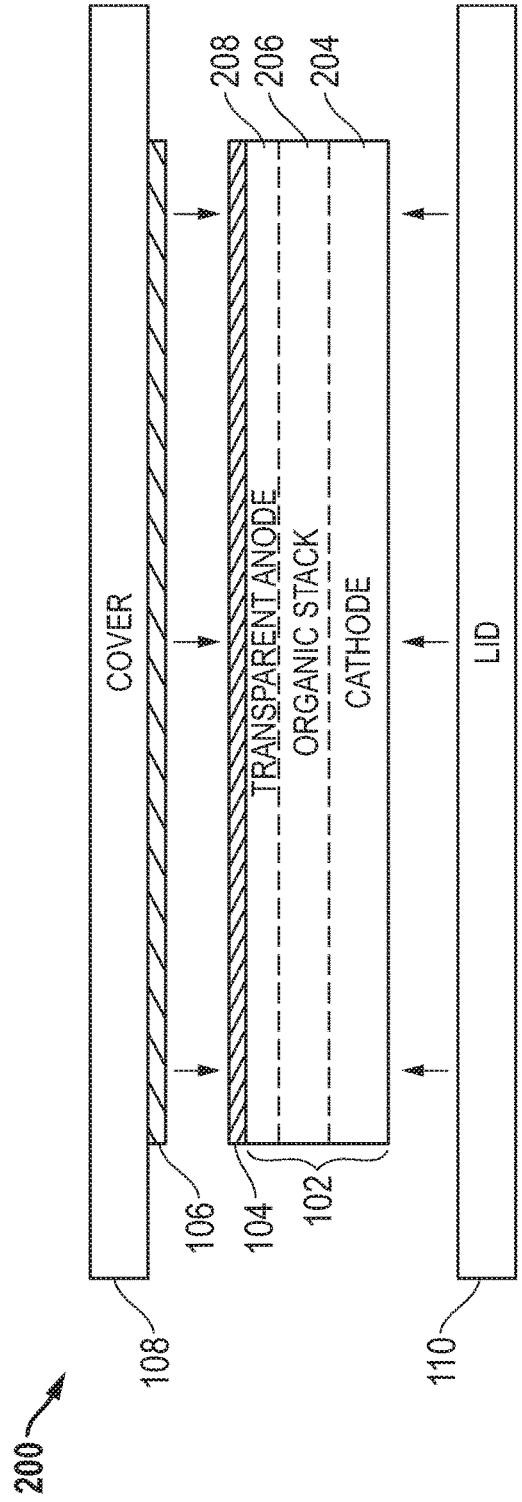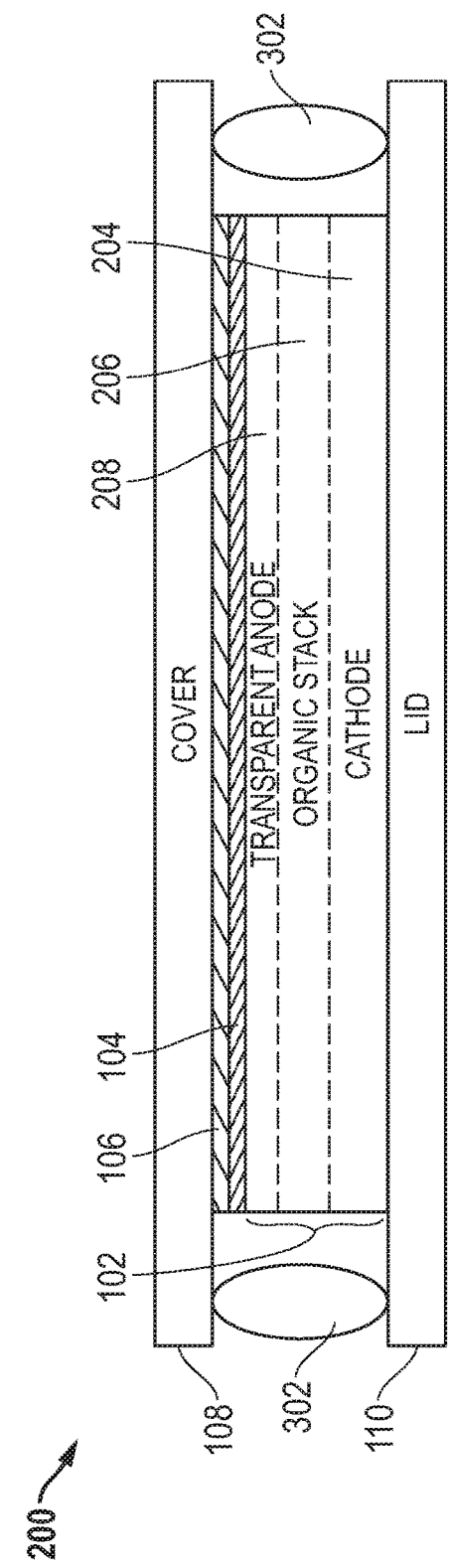

DISPLAY ASSEMBLY APPARATUS AND METHODS FOR INFORMATION HANDLING SYSTEMS

FIELD OF THE INVENTION

This application relates to information handling systems and, more particularly, to display apparatus for information handling systems.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Conventional portable information handling systems include cell phones and tablet computers having integral liquid crystal display (LCD) substrates or Organic Light Emitting Diode (OLED) display substrates. A transparent glass cover such as Corning® Gorilla® Glass (alkali-aluminosilicate sheet glass) is laminated and bonded to the OLED display substrate with a single layer of heat-activated adhesive to form a display assembly. These display assemblies sometimes require repair which necessitates using ultraviolet (UV) light and heat to raise the temperature of the adhesive at or above 100° C. in order to debond and peel off the glass cover from the underlying display substrate. This heating allows the glass layer to be debonded from the display substrate so that the glass cover may be peeled away from the substrate to allow repair of the display or replacement of the glass cover.

It is possible to control whether a single layer adhesive delaminates at the glass cover interface or the display substrate interface by controlling the wavelength of UV light that is applied to the display assembly, i.e., an applied UV light having a first wavelength (such as 248 nanometers) passes through the glass cover mostly unabsorbed and is primarily absorbed by the adhesive layer to activate ablation and debonding at the glass/adhesive interface, while an applied UV light having a second wavelength (such as 308 nanometers) passes through both the glass cover and the adhesive layer mostly unabsorbed to the underlying display substrate where it is absorbed and activates ablation and debonding at the adhesive/display substrate interface.

SUMMARY OF THE INVENTION

Apparatus and methods are disclosed herein that may be implemented to provide multi-layer display assembly apparatus for information handling systems, including portable information handling systems (e.g., such as smart phones, tablet computers, notebook computers, etc.) as well as display assembly apparatus for other types of information handling systems such as desktop computers, servers, etc. The disclosed multi-layer display assembly apparatus may be implemented to include multiple transparent adhesive layers (e.g., two or more transparent adhesive layers) that have different indices of refraction and/or different debonding characteristics, and that are disposed between a display substrate and a transparent protective hardcover such as glass-based or plastic-based cover.

In one embodiment, a multi-layer laminated polymeric hardcover display assembly apparatus may be provided that includes a first adhesive layer that is bonded to a display substrate that is configured to generate a video image (e.g., flexible display substrate such as light emitting diode "LED" substrate, organic light emitting diode "OLED" substrate, transparent organic light-emitting diode "TOLED" substrate, or any other type of display substrate such as liquid crystal display "LCD", etc.). At least a second adhesive layer may be bonded between the first adhesive layer and a transparent cover (e.g., glass-based cover including glass such as optical borosilicate-crown glass (N-BK7); or plastic-based cover such as cyclo-olefin copolymer (COC), cylco-olefin polymer (COP), polyethylene terephthalate (PET), polymethyl methacrylate (PMMA), polycarbonate, styrene, polyester, polyethylenimine (PEI), etc.) so as to mechanically couple and retain the transparent cover to the display-generating substrate through the first and second adhesive layers.

In a further exemplary embodiment, each of the multiple adhesive layers may be selected to have a thickness and/or index of refraction that is optimized (e.g., for best surface hardness and/or optical properties) for a given display apparatus application, e.g., a combination of a relatively lower index first adhesive and a relatively higher index second adhesive may be applied at an optimized thickness to give best structural and optical properties. It will be understood that particular optimized adhesive properties such as indices of refraction and adhesive layer thicknesses will vary from application to application, e.g., with different cover materials, display substrate types, display assembly apparatus form factors, etc. In one embodiment, optimized adhesive properties may be determined empirically in the laboratory using combinations of different types and thicknesses of display assembly apparatus component materials.

In one embodiment, different types of adhesives may be selected for use as the first and second adhesive layers to bond the components of the laminated display assembly together. In such an embodiment the different adhesives of the first and second adhesive layers may be selected to have different debonding characteristics to allow the second adhesive layer to be preferentially debonded from the transparent cover and/or from the first adhesive layer without debonding the first adhesive layer from the display substrate in order to separate (e.g., peel away) the transparent cover from the remainder of the display assembly apparatus without debonding the first adhesive layer from the display substrate. In this way, the transparent cover may be removed from the display assembly apparatus without damaging the display substrate since the first adhesive is left intact and bonded in position over a surface of the display substrate to protect (e.g., structurally strengthen, stiffen and/or cover) the display substrate from damage due to mechanical action associated with separation and removal of the transparent cover from the display assembly apparatus. Moreover, the second adhesive layer may be further selected to debond from the transparent cover and/or first adhesive layer under conditions (e.g., debonding temperatures, debonding light wavelength and/or applied separation force) that are safe for the display substrate. Once removed, the removed transparent cover component may be replaced with a new or repaired transparent cover component that may then be re-bonded to the first adhesive layer with the same or different type of second adhesive layer to reassemble and laminate the repaired display assembly apparatus.

Multiple different adhesive layers having different debonding characteristics may be so employed in one embodiment to bond a transparent cover (e.g., plastic or glass hard cover) to relatively fragile display substrates such as OLED substrates and other flexible display substrate materials. Examples of different debonding characteristics that may be exploited using the disclosed apparatus and methods to achieve preferential debonding of a second adhesive relative to a first adhesive include, but are not limited to, different adhesive curing mechanisms (e.g., thermoplastic adhesive versus thermoset adhesive, etc.), different debonding conditions (e.g., two adhesives having the same or different curing mechanisms but also having different debonding temperatures and/or different debonding light wavelengths, etc.). In one exemplary embodiment, the first adhesive layer may be applied to contact the display substrate, and the second and different type of adhesive layer may be applied to contact the transparent cover. The cover, adhesives and display substrate may be brought together and laminated (e.g., bonded) together using appropriate curing conditions to bond the second adhesive layer and the first adhesive layer together between the display substrate and the cover.

The first and second adhesives having different debonding characteristics may be liquid optically clear adhesives (LOCA), non-liquid optically clear adhesive (OCA) tape, and/or other transparent liquid or tape adhesives that may be applied and bonded in any order and/or manner that results in a laminated assembly that includes the cover bonded to the display substrate by the cured first and second adhesives disposed between the cover and the display substrate. For example, in a first embodiment, the first and second adhesive layers may be separately applied to the respective display substrate and cover before bringing the cover together with the display substrate, in which case one or neither of the first and second adhesive layers may be cured prior to bringing them together between the cover and the display substrate. In such a first embodiment, the uncured adhesive layer/s may then be cured to bond the cover to the display substrate. In a second embodiment, the first and second adhesive layers may be applied together to one of the display substrate or cover before bringing the cover together with the display substrate. In such a second embodiment, one or neither of the first and second adhesive layers may be cured prior to bringing them together between the cover and the display substrate, after which the uncured adhesive layer/s may then be cured to bond the cover to the display substrate.

In a case where the display substrate and cover are brought together with both first and second adhesive layers in an uncured condition, the curing conditions (e.g., temperature and/or light wavelength) may be applied to cure both first and second adhesives at the same time (e.g., such that the first and second adhesive layers may be cured simultaneously), or the curing conditions may be applied to cure the first and second adhesives separately and one at a time (e.g., such that the first and second adhesive layers may be cured sequentially by applying sequentially applying the corresponding curing conditions for each of the different adhesive layers).

In one exemplary embodiment, both the first and second adhesive layers having different debonding characteristics may have the same curing mechanism (e.g., both may be thermoplastic adhesives having different debonding conditions). In such a case, the debonding conditions (e.g., debonding temperature and/or debonding light wavelength) of the second adhesive layer may be different than the debonding conditions (e.g., debonding temperature and/or debonding light wavelength) of the first adhesive layer such that the second adhesive layer may later be debonded from the cover and/or first adhesive layer at the debonding conditions of the second adhesive layer without debonding the first adhesive layer from the display substrate. An example of a combination of layers that debond under different conditions include a first adhesive layer that is a thermoplastic adhesive having a higher debonding temperature and/or different debonding light wavelength than the debonding temperature and/or light wavelength of a second thermoplastic adhesive layer such that the second adhesive layer may be debonded under temperature and/or light wavelength conditions that do not debond the first adhesive layer.

In another exemplary embodiment, the curing mechanism of the second adhesive layer may be different than the curing mechanism of the first adhesive layer, and the first and second adhesive layers may have different debonding conditions such that the second adhesive layer may be later debonded without debonding the first adhesive layer from the display substrate. Examples of a combination of first and second adhesive layers having different curing mechanisms include a case where the first adhesive layer is a thermally curable (requiring application of heat or elevated temperature for curing) and/or light curable thermoset adhesive layer (requiring application of ultraviolet or visible light for curing), and the second adhesive layer is a thermally curable and/or light curable thermoplastic adhesive layer that may be debonded at a temperature and/or light wavelength that does not debond the thermoset adhesive of the first adhesive layer. Another example of a combination of different curing mechanisms is a first adhesive layer that is a light curable or chemically-activated (e.g., moisture-activated or activated with other activator) curable adhesive layer combined with a second adhesive layer that is thermally curable adhesive layer that may be debonded at a temperature and/or light wavelength that does not debond the light curable thermoset adhesive of the first adhesive layer. Another example of a combination of different curing mechanisms is a first adhesive layer that is a thermally curable adhesive layer combined with a second adhesive layer that is light curable or chemically-activated adhesive layer that may be debonded at a temperature and/or light wavelength that does not debond the thermally curable adhesive of the first adhesive layer In any of the above embodiments, the first adhesive may remain bonded to the first display substrate to strengthen and/or protect the first display substrate while the second adhesive layer is debonded to allow the cover to be removed from the laminated assembly.

In one embodiment both the first and second adhesive layers having different debonding characteristics may be brought together in uncured condition between the display substrate and the cover, and then appropriate curing light wavelength/s and/or curing temperature/s applied to the assembly in order to cure and bond the first and second adhesive layers to each other and to the display substrate and cover, respectively to form a laminated display assembly apparatus. In such an embodiment, the curing conditions (e.g., temperature and/or light wavelength) for the first and second adhesive layers may be the same (e.g., such that the first and second adhesive layers cure simultaneously), or may be different (e.g., such that the first and second adhesive layers cure sequentially according to sequence with which the corresponding curing conditions for the different adhesive layers are applied). However, in either case the first and second adhesives may be selected such that the debonding conditions for the first and second adhesive layers are different from each other after they are cured.

In another embodiment, a first adhesive layer may be separately applied, cured and bonded to the display substrate with appropriate curing temperature and/or curing light wavelength for the first adhesive layer, and a second adhesive layer may be separately applied to the cover before bringing the cover and its uncured second adhesive layer together with the display substrate and in contact with the cured first adhesive layer between the display substrate and the cover. The second adhesive layer may then be cured with appropriate curing temperature and/or curing light wavelength for the second adhesive layer to bond the second adhesive layer to the first adhesive layer to laminate the cover, adhesives and display substrate together. In this embodiment, the first adhesive layer may remain bonded to the first display substrate to strengthen and/or protect the first display substrate both while the second adhesive layer is cured and while the second adhesive layer is debonded at the debonding conditions of the second adhesive layer to allow the cover to be removed from the laminated assembly without damaging the display substrate.

In one exemplary embodiment, the first and second adhesives may be selected to facilitate delamination of a transparent cover from a display substrate of a display assembly apparatus to facilitate repair or replacement of the cover without damaging the display substrate. For example, a second adhesive may be selected that debonds from a first adhesive layer and/or transparent cover at a first debonding temperature (e.g., less than 100° C., alternatively from 50° C. to less than 100° C., and alternatively from 65° C. to 95° C.) that is safe for relatively fragile display substrates (e.g., such as OLED display substrates), and that is lower than the typical 100° C. or greater debonding temperature of a conventional single layer adhesive that is used to bond a LCD substrate to a transparent cover. In this regard, while LCD substrates are typically capable of withstanding temperatures of 100° C. or greater together with the level of mechanical force required by glass cover conventional lamination and delamination processes, the combination of such mechanical forces and relatively higher temperatures are damaging to newer relatively fragile display substrate types such as OLED display substrates. At the same time, the first adhesive may also be selected to not debond from the display substrate at the first debonding temperature but to remain bonded to the display substrate during delamination of the transparent cover (e.g., such as during disassembly and repair of the display assembly apparatus) such that the strength and presence of the first adhesive layer protects the OLED display substrate from mechanical delamination forces that would otherwise damage the OLED display substrate.

In another exemplary embodiment, the disclosed display assembly apparatus may employ a first adhesive layer having a first index of refraction that is bonded to a display substrate, and at least a second adhesive layer having a second index of refraction that is bonded between the first adhesive layer and a transparent cover (e.g., plastic or glass hardcover) so as to mechanically couple and retain the transparent cover to the display-generating substrate through the first adhesive layer. In a further embodiment, the index of refraction of the second adhesive layer may be higher than the index of refraction of the first adhesive layer such that more light is conducted (and less light is reflected) at the interface between the second adhesive layer and the transparent cover. Multiple (e.g., two) adhesive layers having different indices of refraction (e.g., low index to high index in the direction of light transmittance) may be so employed in one exemplary embodiment to bond a transparent cover (e.g., plastic hard cover such as COC or COP) to display substrates such as OLED display substrates and other flexible display substrate materials in a manner that collimates transmitted light and enhances transmission of light across the interface between the transparent adhesives and the transparent cover. This may be particularly advantageous for improving optical performance when a plastic-based transparent cover is bonded to a display substrate. Thus, in one embodiment, a polymeric hardcover assembly may be provided for OLED display or other types of display substrates using multi-index bilayer adhesive.

In one respect, disclosed herein is an apparatus, including: a display substrate having opposite first and second sides, the display substrate being configured to generate a video image through at least the first side of the display substrate; and a transparent cover bonded to the first side of the display substrate by multiple different transparent adhesive layers disposed between the transparent cover and the first side of the display substrate, the multiple transparent adhesive layers including a first transparent adhesive layer bonded to the first side of the display substrate and a second transparent adhesive layer bonded to the transparent cover; where the first transparent adhesive layer has debonding characteristics that are different from debonding characteristics of the second transparent adhesive layer, where the second transparent adhesive layer has an index of refraction that is higher than the index of refraction of the first transparent adhesive layer, or a combination thereof.

In another respect, disclosed herein is a method, including: bonding a transparent cover to a first side of a display substrate using multiple different transparent adhesive layers disposed between the transparent cover and the first side of the display substrate, the multiple transparent adhesive layers including a first transparent adhesive layer bonded to the first side of the display substrate and a second transparent adhesive layer bonded to the transparent cover. The first transparent adhesive layer may have debonding characteristics that are different from debonding characteristics of the second transparent adhesive layer, and the second transparent adhesive layer may have an index of refraction that is higher than the index of refraction of the first transparent adhesive layer, or a combination thereof.

In another respect, disclosed herein is a method, including delaminating a first transparent cover from a first side of a display substrate by: selectively debonding a second transparent adhesive layer that is bonded between the first transparent cover and a first transparent adhesive layer that is bonded to the first side of the display substrate without debonding the first transparent adhesive layer from the first side of the display substrate; and then separating the first transparent cover from the first side of the display substrate.

BRIEF DESCRIPTION OF THE DRAWINGS

FIG. 2 illustrates an exploded side cross-sectional view of a display assembly apparatus during lamination and assembly according to one exemplary embodiment of the disclosed apparatus and methods.

FIG. 3 illustrates a side cross-sectional view of an assembled display assembly apparatus according to one exemplary embodiment of the disclosed apparatus and methods.

DESCRIPTION OF ILLUSTRATIVE EMBODIMENTS

Figure 1A:
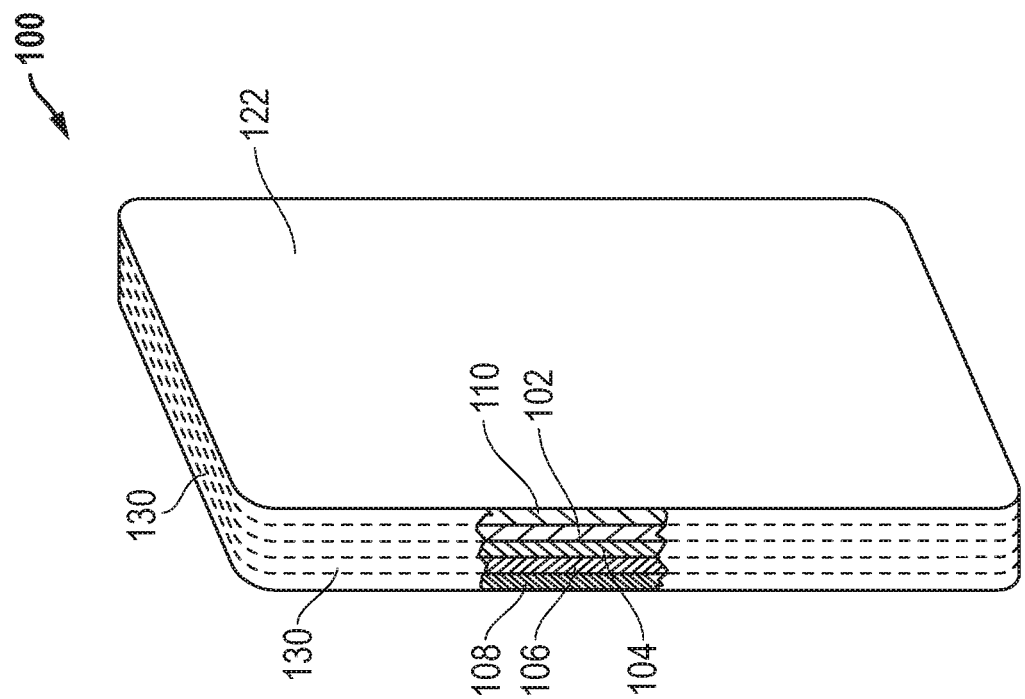
FIG. 1A illustrates a frontal cut-away perspective view of a portable information handling system according to one exemplary embodiment of the disclosed apparatus and methods.

FIG. 1A illustrates a frontal cut-away perspective view of one exemplary embodiment of a portable information handling system 100 which may be, for example, a smart phone, tablet computer, etc. having a display assembly apparatus that may or may not additionally be additionally configured as a touch screen display apparatus. Examples of portable information handling systems may be found described in U.S. patent application Ser. No. 15/471,901 filed on Mar. 28, 2017; U.S. patent application Ser. No. 15/589,468 filed on May 8, 2017; U.S. patent application Ser. No. 15/498,035 filed Apr. 26, 2017; U.S. Pat. Nos. 8,115,698; and 8,506,085, each of which is incorporated herein by reference in its entirety for all purposes. Although FIG. 1A illustrates a portable information handling system embodiment, it will be understood that the disclosed apparatus and methods are implemented with other types of display devices, such as flat panel displays for desktop or tower computers, all-in-one computers, etc.

Still referring to FIG. 1A, portable information handling system 100 includes an outer front display surface 120 where a user may view images projected by an integral display assembly apparatus, the components of which are contained within a chassis enclosure of system 100 but which are visible in cut-away section of FIG. 1A. In FIG. 1A, these components include a transparent cover 108 (e.g., glass-based cover such as glass-based cover including glass such as optical borosilicate-crown glass (N-BK7); or plastic-based cover such as cyclo-olefin copolymer (COC), cyclo-olefin polymer (COP), polyethylene terephthalate (PET), polymethyl methacrylate (PMMA), polycarbonate, styrene, polyester, polyethylenimine (PEI), etc.) that is bonded to a display substrate 102 (e.g., OLED display, LED display, LCD, TOLED display, etc.) by at least a first adhesive layer 104 and a second adhesive layer 106. In one embodiment, transparent cover 108 may be 0.5 millimeters thick, although a thickness of cover 108 may alternatively be greater or lesser than 0.5 millimeters as desired or needed for a given display configuration and/or optical transparency. In another embodiment, transparent cover 108 may be a composite material that includes two or more polymer layers combined for better properties or other reasons, e.g., such as a 0.2 millimeter thick PMMA layer combined or laminated with a 0.2 millimeter COC layer for improved thermal stability. In FIG. 1A, a lid 110 is shown provided on the back side of information handling system 100 to protect and contain the other components of the display assembly apparatus within the chassis enclosure. In this embodiment, the chassis enclosure of system 100 is defined by sides 130 and lid 110 which contain components 102, 104 106 and 108 therein.

Figure 1B:
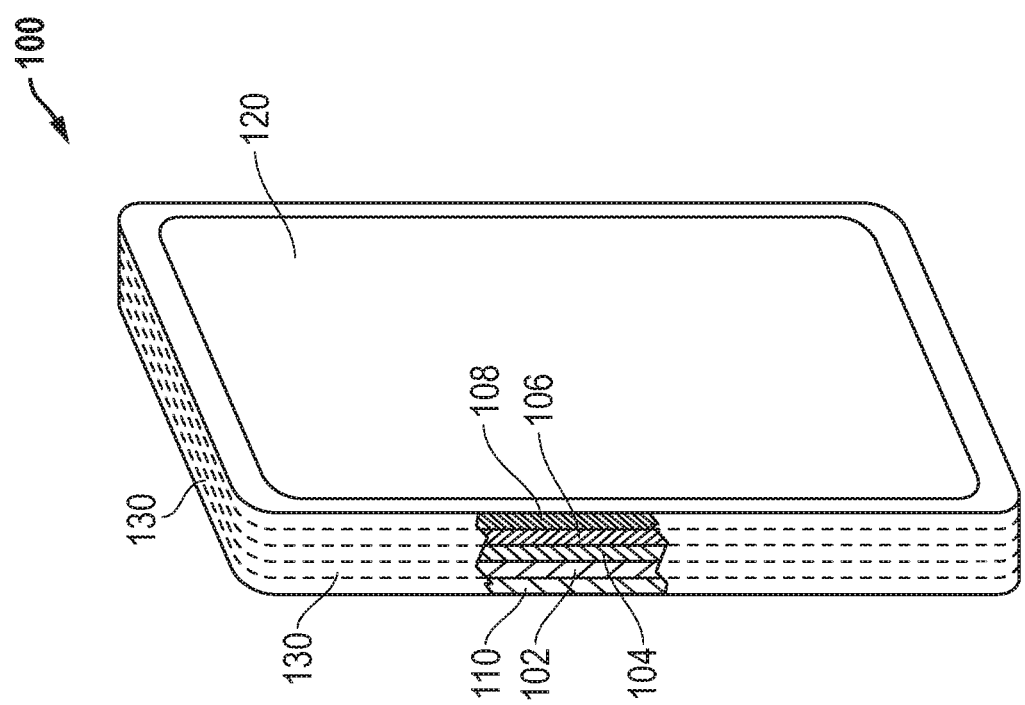
FIG. 1B illustrates a rear cut-away perspective view of a portable information according to one exemplary embodiment of the disclosed apparatus and methods.

FIG. 1B illustrates a rear cut-away perspective view of the portable information handling system 100 of FIG. 1A. As shown in FIG. 1B, portable information handling system 100 includes an outer rear surface 122 that may be defined by an outer rear surface of lid 110. In one embodiment lid 110 may be opaque metal (e.g., aluminum, titanium, etc.) or opaque plastic. However, in another embodiment it is also possible that lid 110 may be composed of a transparent material to allow images to be displayed through the rear surface 122 of system 100, which may be the case in an embodiment where display substrate 104 is optionally configured as a transparent organic light-emitting diode (TOLED) to display both frontal and rearward images. Examples of transparent lid materials include any of the types of materials described in relation to transparent cover 108 (e.g., glass-based such as optical borosilicate-crown glass (N-BK7); or plastic-based such as cyclo-olefin copolymer (COC), cyclo-olefin polymer (COP), polyethylene terephthalate (PET), polymethyl methacrylate (PMMA), polycarbonate, styrene, polyester, polyethylenimine (PEI), etc.)

FIG. 2 illustrates an exploded side cross-sectional view of a display assembly apparatus 200 according to one exemplary embodiment of the disclosed systems and methods which may be employed, for example, in a portable information handling system embodiment such as illustrated and described in relation to FIGS. 1A and 1B. In the embodiment of FIG. 2, a flexible organic light-emitting diode (OLED) display substrate 102 is provided that includes a cathode layer (e.g., top electrode thin film) 204, organic stack layer (e.g., layers of small molecule and/or polymer materials) 206 and transparent anode layer (e.g., bottom electrode thin film) 208. A transparent cover 108 glass-based such as previously described is shown positioned for bonding to display substrate 102 by first adhesive layer 104 and second adhesive layer 106.

In one embodiment display substrate 102 may be configured as an OLED display device to generate and display frontal images through adhesive layers 104 and 106, transparent anode layer 208 and transparent cover 108. In a further optional embodiment, cathode layer 204 may also be transparent, e.g., to implement display assembly apparatus 200 as a TOLED display device that is also configured to generate and display rearward images through cathode 204 and a transparent lid 110 such as previously described. Moreover, position of anode and cathode may be reversed (or exchanged) in other embodiments, e.g., an OLED display device may be configured with first adhesive layer 104 and second adhesive layer 106 disposed between a front-side transparent cathode layer and a cover 108, in which case frontal images may be displayed through the transparent cathode, adhesive layers 104 and 106, and transparent cover 108 with an opaque or transparent backside anode being disposed adjacent lid 110. Further information on OLED display devices that may be implemented as OLED substrates in information handling systems may be found, for example, in U.S. Pat. No. 9,760,122 and in U.S. Pat. No. 9,837,020, each of which is incorporated herein by reference in its entirety for all purposes.

In other embodiments, a display substrate may further implement a touch panel for receiving touch input from a user, e.g., such as described in U.S. patent application Ser. No. 15/589,468 filed on May 8, 2017; and U.S. patent application Ser. No. 15/498,035 filed Apr. 26, 2017, each of which is incorporated herein by reference in its entirety. For example, in one embodiment display substrate 102 may further include a touch screen glass disposed for such a touch screen panel between the transparent anode 208 and the first adhesive layer 104.

Still referring to FIG. 2, cover 108, display substrate 102 and lid 110 are shown positioned for assembly together in the direction of the arrows with first adhesive layer 104 already applied to front outer surface of display substrate 102, and with second adhesive layer 106 already applied to the inside surface of cover 108. Lid 110 is also shown positioned in FIG. 2 for assembly to display substrate 102 so as to enclose display substrate 102 between lid 110 and cover 108 in a manner as shown in FIG. 3.

In one embodiment, first adhesive layer 104 and second adhesive layer 106 may have different adhesive curing mechanisms and/or different debonding characteristics from each other so as to allow selective debonding of the second adhesive layer 106 without debonding the first adhesive layer 104. For example, each of first adhesive layer 104 and second adhesive layer 106 may be UV or visible light-activated adhesives that are activated for bonding or debonding by different UV or visible light wavelengths, first adhesive layer 104 may be a thermally activated adhesive and second adhesive layer 106 may be UV or visible light-activated adhesive (or vice-versa), each first adhesive layer 104 and second adhesive layer 106 may be thermally activated adhesives with different thermal activation temperatures (e.g., melting points), etc. Thus, in one exemplary embodiment, the first adhesive layer may be applied to the display substrate 102 and the second and different type of adhesive layer may be separately applied to the cover 108.

Table 1 below lists different types of adhesives which may be employed in the practice of the disclosed systems and methods. In this regard, it will be understood that selection of the first adhesive layer 104 relative to a given second adhesive layer 106 for forming a given laminated display assembly may be made based on the individual debonding characteristics and/or curing mechanism of the two adhesive layers 104 and 106 relative to each other in order to achieve the preferential debonding of the second adhesive layer 106 described herein. Manufacturers or sources of transparent and/or optically clear adhesives include, but are not limited to, 3M™ Company of Maplewood, Minn.; Henkel™ AG & Company of Dusseldorf, Germany; NTT Advanced Technology Corporation (NTTAT™) of Kanagawa, Japan, etc.

With regard different adhesives such as listed in Table 1, adhesive layers 104 and 106 may be selected to have different debonding characteristics (e.g., which may result from different adhesive curing mechanisms temperature resistance characteristics, etc. for the first and second layers 104 and 106) so as to allow cover 108 and second adhesive layer 106 to be selectively debonded and peeled away (or otherwise removed) from first adhesive layer 104 and display substrate 102 while at least a portion of first adhesive layer 104 remains in place bonded to and protecting display substrate 102. It will be understood that the example adhesive adhesives of Table 1 are exemplary only, and that any other combination of these and/or other adhesives may be employed to achieve a cured adhesive layer stackup or laminated structure in which the second adhesive layer may 106 be later selectively debonded to allow cover 108 to be removed from the assembly 200 while leaving the first adhesive layer 104 intact and bonded to display substrate 102. Specific example combinations include, but are not limited to, a thermosetting urethane-based first adhesive layer 104 and a thermoplastic light curable acrylate-based second adhesive layer 106 (e.g., such as 3M™ Light Cure Adhesive LC-1215, 3M™ Light Cure Adhesive LC-1113, etc.). In such an embodiment, 3M™ Light Cure Adhesive LC-1215 is curable by application of either ultraviolet (UV) light wavelength of 250 to 380 nanometers or visible light wavelength of 400-500 nanometers; and 3M™ Light Cure Adhesive LC-1113 is curable only by application of UV light wavelength of 250-380 nanometers. It is also noted that a combination of light curable adhesive and urethane adhesive type may be employed for plastic to metal bonding, or plastic to rubber bonding.

TABLE 1

| Adhesive | Curing Mechanism Type | * Example Maximum Temperature Resistance for Cured Adhesive Type |
|---|---|---|
| Silicone | UV light curable only (Thermoplastic) | 350° F. (177° C.) |
| Silicone | UV light + thermally curable (Thermoplastic) | 350° F. (177° C.) |
| One-Component Epoxy | Thermally Curable (Thermoset) | 300° F. (149° C.) |
| Two-Component Epoxy | Chemically-activated cure (e.g., at room temperature) | 300° F. (149° C.) |
| Urethane | Thermally Curable (Thermoset) | 250° F. (121° C.) |
| Urethane | Thermally Curable (Thermoplastic) | 250° F. (121° C.) |
| Acrylate (acrylic) | UV or Visible Light Curable (Thermoset) | 150° C. (302° F.) |
| Acrylate (acrylic) | UV or Visible Light Curable (Thermoplastic) | 150° C. (302° F.) |
| Cyanoacrylate | Chemically-activated cure (e.g., at room temperature) | 180° F. (82° C.) |

* Example values only: actual maximum temperature resistance will vary for different compounds of the same adhesive type.

In one exemplary embodiment, a thickness of a first adhesive layer 104 may be from 5 mils down to 0.5 mils based on display size, alternatively from greater than 0.5 mil to less than 5 mils, alternatively from greater than 1 mil to less than 5 mils, alternatively from 1 mil to 3 mils, alternatively from 2 mils to 3 mils, and further alternatively from 1 mil to 2 mils, it being understood that thickness of first adhesive layer 104 may alternatively be less than 0.5 mil or greater than 5 mils in other embodiments. In the same embodiment, a thickness of a second adhesive layer 106 may be from 0.5 mil to 5 mils, alternatively from greater than 0.5 mil to less than 5 mils, alternatively from greater than 1 mil to less than 5 mils, alternatively from 1 mil to 3 mils, alternatively from 2 mils to 3 mils, and further alternatively from 1 mil to 2 mils, it being understood that thickness of second adhesive layer 106 may alternatively be less than 0.5 mil or greater than 5 mils in other embodiments. In one exemplary embodiment, each of first adhesive layer 104 and second adhesive layer 106 may have a thickness of 50 microns (or about 50 microns) to achieve both good light out-coupling and good bonding strength with surface deformation reduction, although adhesive layer thicknesses may be greater or lesser.

As shown in FIG. 3, the cover 108, adhesives 104/106, and display substrate 102 may be brought together and laminated together using appropriate curing light wavelength or curing temperature to simultaneously bond the first and second adhesive layers 104 and 106 to each other to form an assembled display assembly apparatus 200 with a lid 110. During this lamination process, the first adhesive 104 strengthens (e.g., stiffens) and protects the flexible OLED display substrate 102. In FIG. 3, cover 108 is mechanically coupled and retained to the display substrate 102 through the first adhesive layer 104 and the second adhesive layer 106 that have been bonded together as shown. An optional perimeter (border) sealant 302 (e.g., such as 1 millimeter wide layer of epoxy or TP7155 thermoplastic film available from AI Technology of Princeton Jct., N.J.) is shown applied around the edges of the assembled display assembly apparatus 200. In one embodiment, sealant 302 may be configured to form sides 130 of information handling system 100 of FIGS. 1 and 2, with edge of cover 108 folded down in one embodiment and bonded to a metal or plastic frame that is part of (or is mechanically coupled to) lid 110. An outer veneer layer (e.g., thin plastic or metal) may also be applied to sealant 302 to form the outer surfaces of sides 130. A frame of a lid 110 may also be foldable in one embodiment (e.g., for a virtual reality headset), in which case bonding of cover 108 to the frame may be made using a rubber-based adhesive such as elastomer.

Figure 4:
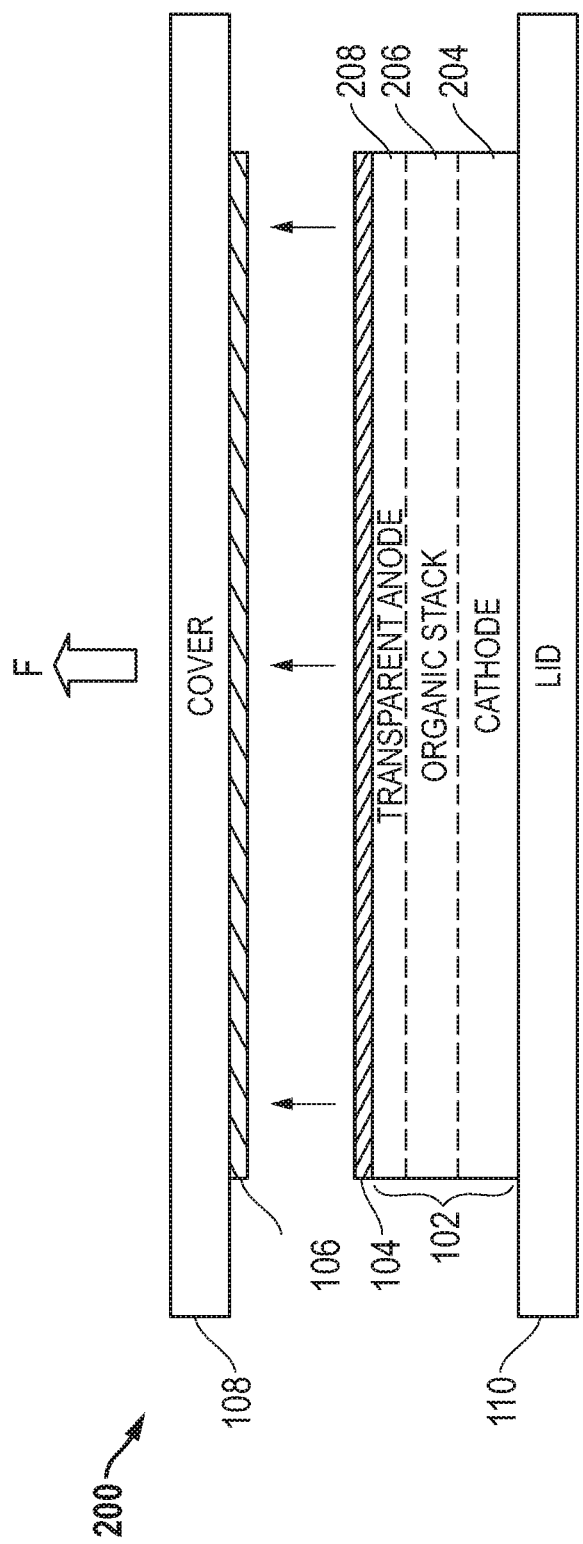
FIG. 4 illustrates an exploded side cross-sectional view of a display assembly apparatus during delamination and disassembly according to one exemplary embodiment of the disclosed apparatus and methods.

FIG. 4 illustrates debonding and disassembly of cover 108 of display assembly apparatus 200, e.g., which may occur in the field after the components of display assembly apparatus 200 have been assembled in the factory or original manufacturing facility as shown in FIGS. 2 and 3. As shown in FIG. 4, second assembly layer 106 has been detached and delaminated from first adhesive layer 104 at the interface between the first and second adhesive layers in the direction of the arrows. In this manner, cover 108 may be removed (e.g., for repair or replacement) from the assembled display apparatus assembly with first adhesive layer 104 remaining in place bonded to display substrate 102 so as to strengthen, stiffen and/or protect (e.g., shield) flexible OLED display substrate 102 from damage caused by mechanical action and/or manipulation that would otherwise occur during the removal process. In the embodiment of FIG. 4, second adhesive layer 106 has been selectively debonded from first adhesive layer 104 by application of an appropriate thermal debonding temperature and/or UV or visible light debonding wavelength together with a separation force "F" that is sufficient to meet the debonding conditions for second adhesive layer 106 but that is not sufficient to cause second adhesive layer 106 to debond or otherwise release from first adhesive layer 104. Examples of such thermal debonding temperatures and UV or visible light debonding wavelengths for particular first and second adhesive layer combinations are given in Table 1 as previously described. After cover 108 has been delaminated from display assembly apparatus 200 and repaired or replaced, it may then be laminated again to display substrate 102 in similar manner as illustrated and described in relation to FIGS. 2 and 3, with application and bonding of new or additional adhesive material for second adhesive layer 106 when this is needed.

In another exemplary embodiment of FIGS. 2-4, a multi-layer laminated polymeric hardcover display assembly apparatus 200 may employ a first adhesive layer 104 having a first index of refraction that is bonded to display substrate 102, and a second adhesive layer 106 having a second index of refraction. In such an embodiment, the index of refraction of the second adhesive layer 106 may be higher than the index of refraction of the first adhesive layer 104 such that more light is conducted (and less light is reflected) at the interface between the second adhesive layer 106 and the transparent cover 108. In a further embodiment, the index of refraction of the second adhesive layer 106 may also be selected to be higher than the index of refraction of the first adhesive layer 104 and lower than the index of refraction of the transparent cover 108.

Table 1 below lists indices of refraction for glass and different types of optical thermoplastics which may be employed as material for cover 108. In one embodiment, the index of refraction for a given type of cover material may be used to select adhesive materials based on index of refraction so as to achieve improved optical performance (e.g., such as improved light collimation) in a manner as described further herein.

TABLE 2

| Optical Cover Material | Index of Refraction (measured at the yellow doublet D-line of sodium, with a wavelength of 589.2 nanometers) |
| --- | --- |
| PEI | 1.68 |
| Polyester | 1.61 |
| Styrene | 1.59 |
| Polycarbonate | 1.585 |
| COC | 1.53 |
| COP | 1.53 |
| N-BK7 Glass | 1.52 |
| PMMA | 1.49 |

Table 3 below lists different indices of refraction for different example adhesives that may be employed for first adhesive layer 104 and second adhesive layer 106 in a display assembly apparatus embodiment such as FIG. 2. In this regard, adhesive layers 104 and 106 of may be selected to have different indices of refraction in the manner described above, and optionally relative to the index of refraction of a cover 108. It will be understood that the example adhesives of Table 3 are exemplary only, and that any combination of the listed adhesives and/or other adhesives may be employed to achieve a cured adhesive layer stackup in which the second adhesive layer may 106 has a higher index of refraction than first adhesive layer 104 (and optionally having a lower index of refraction than the transparent cover 108). In one exemplary embodiment, a higher index of refraction may be achieved for a second adhesive layer 106 relative to the index of refraction for the first adhesive layer 106 by employing an adhesive for second adhesive layer 106 that includes transparent particles (e.g., such as transparent conductive graphene particles). In one embodiment, presence of such transparent particles (e.g., graphene particles) dispersed in the selected second adhesive layer 106 act as a heat concentrator, and a different index of refraction of the particles relative to the adhesive material helps capture energy. Thus, as the particles heat up, it disperses the heat throughout the adhesive to increase the speed of the heating process. Thus, presence of the particles may allow for thermal spreading through the second adhesive layer 106 and relatively easy delamination of cover 108 from the display assembly without imparting much (if any) heat to the underlying display substrate 102 (e.g., such as a heat-sensitive OLED display substrate).

TABLE 3

| Adhesive | Adhesive Index of Refraction |
|---|---|
| 3M ™ Optically Clear Adhesives 8171, 8172, 8180, 8182, 8185, 8187, 8188, 8189, 9483 | 1.47 (i.e., 1.473 to 1.475) |
| 3M ™ Light Cure Adhesive LC-1113 | 1.56 |
| NTTAT ™ Acrylic Resin #18165 | 1.675 |
| NTTAT ™ Acrylic Resin #6205 | 1.720 |
| NTTAT ™ Epoxy Resin E3754 | 1.603 |
| NTTAT ™ Epoxy Resin #7200 | 1.627 |
| NTTAT ™ Acrylic Resin #18204 | 1.375 |
| NTTAT ™ Acrylic Resin #18114 | 1.400 |
| NTTAT ™ Epoxy Resin E3810 | 1.438 |

Figure 5:
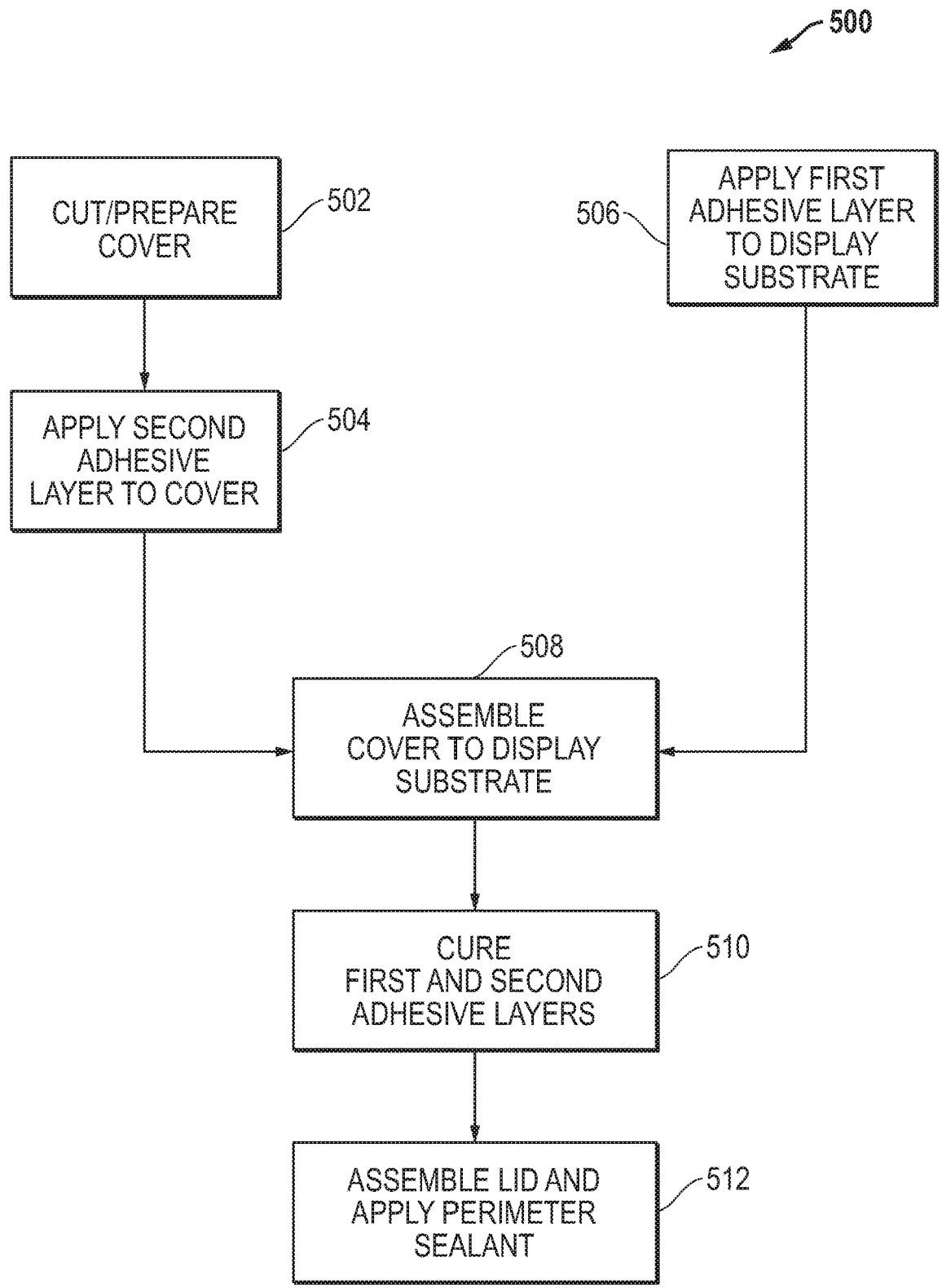
FIG. 5 illustrates methodology according to one exemplary embodiment of the disclosed apparatus and methods.

FIG. 5 illustrates an exemplary embodiment of a methodology 500 that may be employed to laminate components of a display assembly apparatus 200 having a first adhesive layer 104 and second adhesive layer 106 that have different adhesive curing mechanisms and/or different debonding characteristics from each other in the manner described above in relation to Table 1 and FIGS. 2-3. As shown, methodology 500 begins in step 502 where cover 108 is cut to size and prepared for assembly to other components of display assembly apparatus 200. In step 504, second adhesive layer 106 is applied to the inside (e.g., bottom side) surface of cover 108, e.g., by application method such as spray or brush-on of liquid adhesive, or cut and place of tape adhesive. In separate step 506, first adhesive layer 106 is applied to outside (e.g., top side) surface of display substrate 102, e.g., by application method such as spray or brush-on of liquid adhesive, or cut and place of tape adhesive. In an alternate embodiment, both adhesive layers 104 and 106 may be applied to only one of the cover 108 or display substrate 102, before bringing the cover 108 together with the display substrate 102 with the adhesive layers 104 and 106 in uncured condition therebetween. In either case, in step 508 the cover 108 is assembled to the display substrate 102 with the uncured adhesive layers 104 and 106 therebetween and contacting each other as shown in FIG. 3, and the first and second adhesive layers 104 and 106 sequentially or simultaneously cured in step 510 using appropriate curing conditions for selected adhesives of the first and second adhesive layers. Lid 110 may be assembled in step 512 to the other components of display apparatus assembly 200 as shown in FIGS. 2-3, and optional perimeter sealant 302 applied and cured or allowed to cure.

It will be understood that the methodology of FIG. 5 is exemplary only, and that in other embodiments, a first adhesive layer 104 may be separately applied, cured and bonded to the display substrate 102 with appropriate curing temperature and/or curing light wavelength for the first adhesive layer 104, and a second adhesive layer 106 may be separately applied to the cover 108 before bringing the cover 108 and its uncured second adhesive layer 106 together with the display substrate 102 and in contact with the cured first adhesive layer 104 between the display substrate 102 and the cover 108. The second adhesive layer may then be cured with appropriate curing temperature and/or curing light wavelength for the second adhesive layer 106 to bond the second adhesive layer 106 to the first adhesive layer 104 to laminate the cover 108, adhesives 104/106 and display substrate 102 together.

Figure 6:
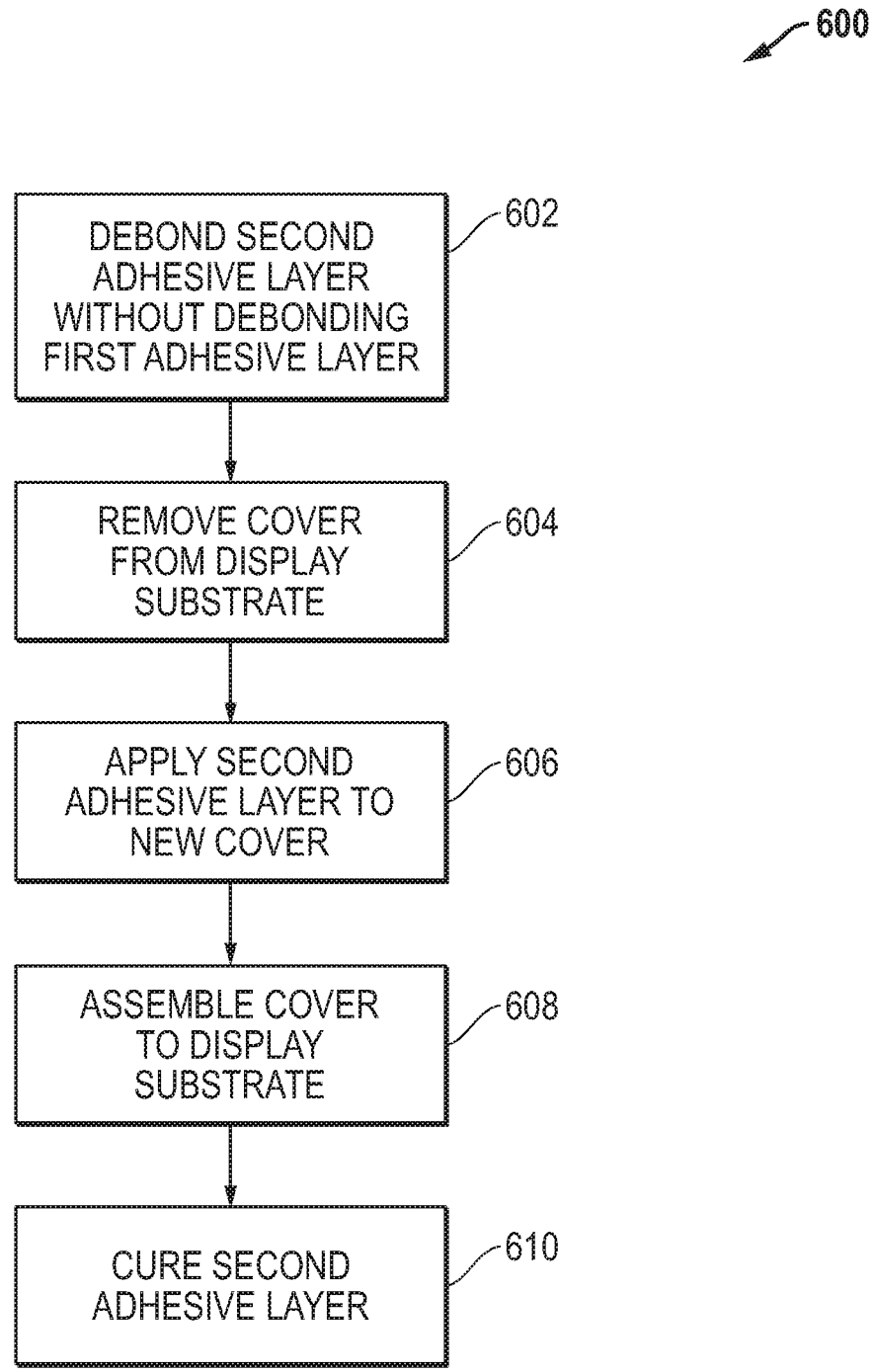
FIG. 6 illustrates methodology according to one exemplary embodiment of the disclosed apparatus and methods.

FIG. 6 illustrates an exemplary embodiment of a methodology 600 that may be employed to delaminate and replace the cover 108 of an assembled display assembly apparatus 200 of FIG. 5 that has a first adhesive layer 104 and second adhesive layer 106 that have different adhesive curing mechanisms and/or different debonding characteristics from each other in the manner described above in relation to Table 1 and FIG. 4. As shown, methodology 600 begins in step 602 where second adhesive layer 106 is selectively debonded from the display assembly apparatus 200 by applying selective debonding conditions to the display assembly apparatus (e.g., temperature and/or UV or visible light wavelength) in optional combination with a mechanical separation force that pulls cover 108 apart from display substrate 102 so as to only debond second adhesive layer 106 and not first adhesive layer 104. For example a debonding temperature that meets the debonding temperature for second adhesive layer 106 but that is below the debonding temperature of the first adhesive layer 104 may be applied, and/or a debonding UV or visible light wavelength that meets the debonding temperature for second adhesive layer 106 but that does not meet the debonding UV or visible light wavelength required to debond the first adhesive layer 104 may be applied.

In one embodiment, the debonding temperature for a given thermoplastic second adhesive layer may be lower than the curing (or bonding) temperature for the given thermoplastic second adhesive layer when a mechanical separation force is applied simultaneously with the debonding temperature in step 602, (e.g., from 10° C. to 20° C. lower, or any greater or lesser temperature amount lower depending on the magnitude of the particular debonding separation force applied). For example, in one embodiment, a 600 kilopascals per square inch separation (e.g., tension) force may be applied to pull apart the cover 108 from the display substrate 102 simultaneous with application of a debonding temperature below 100° C. (e.g., such as 95° C. debonding temperature or alternatively from 85° C. to below 100° C. debonding temperature, etc.) for a thermoplastic second adhesive layer 106 that has a bonding temperature of 105° C. to 115° C., it being understood that a greater separation force may be applied to lower the debonding temperature even further. In this regard, separation force may be selected as needed or desired to achieve the desired second adhesive layer 106 debonding temperature without damaging the display substrate 102, and the presence of a bonded first adhesive layer 104 on display substrate 102 may serve to stiffen and/or strengthen the display substrate 102 to allow a greater magnitude of separation force to be applied without damaging the display substrate 102. It will also be understood that the above bonding temperature and debonding temperature examples are exemplary only, and may be greater or lesser depending on the adhesives selected for a given application.

Thus, as an illustrative example, the second adhesive layer 106 described above having a debonding temperature of 95° C. at a 600 kilopascals per square inch separation force may be combined with a first adhesive layer 104 having a debonding temperature of 150° C. at the same 600 kilopascals per square inch separation force in a laminated display assembly apparatus 200. In such an example, a cover 108 of the laminated display assembly apparatus 200 will separate at the second adhesive layer 106 from the other components of the display assembly apparatus 200 upon application of a 600 kilopascals per square inch separation force simultaneously with a debonding temperature that is greater than or equal to 95° C. (e.g., greater than or equal to 95° C. and less than 100° C.) and less than 150° C.), while the first adhesive layer 104 remains in place and bonded to the display substrate 102.

Next, in step 604, cover 108 may be delaminated and removed from the display apparatus assembly 200 as illustrated by the arrows in FIG. 4. In FIG. 4, optional perimeter sealant 302 has been removed mechanically, e.g., by insertion of a knife or other type of blade between the perimeter cover 108 and lid 110. Next, in step 606 a new second adhesive layer 106 may be applied to a replacement (e.g., new) cover 108 or to the same removed cover 108 in the case where the removed cover 108 is undamaged and a repair is made to the display substrate 102 and/or where the cover 108 has been repaired. The second adhesive layer 106 may be selected based on the properties of the existing first adhesive layer 104 on the display substrate 102 such that the second adhesive layer 106 may be activated or cured without debonding the existing first adhesive layer 104 remaining on display apparatus assembly 200, e.g., corresponding to one of the layer combinations of Table 1. Then, in step 608 the replacement cover 108 may be brought together with, and assembled to, the display substrate 102 with the adhesive layers 104 and 106 therebetween, in the manner illustrated by the arrows in FIG. 2. The second adhesive layer 106 is then cured in step 610 using curing conditions that do not debond the existing first adhesive layer 104 on display substrate 102 (e.g., such as where second adhesive layer 106 is light curable, chemically-activated, or otherwise curable at a curing temperature that is less than a debonding temperature of the first adhesive layer 104). Optional perimeter sealant 302 may be replaced at this time.

Figure 7:
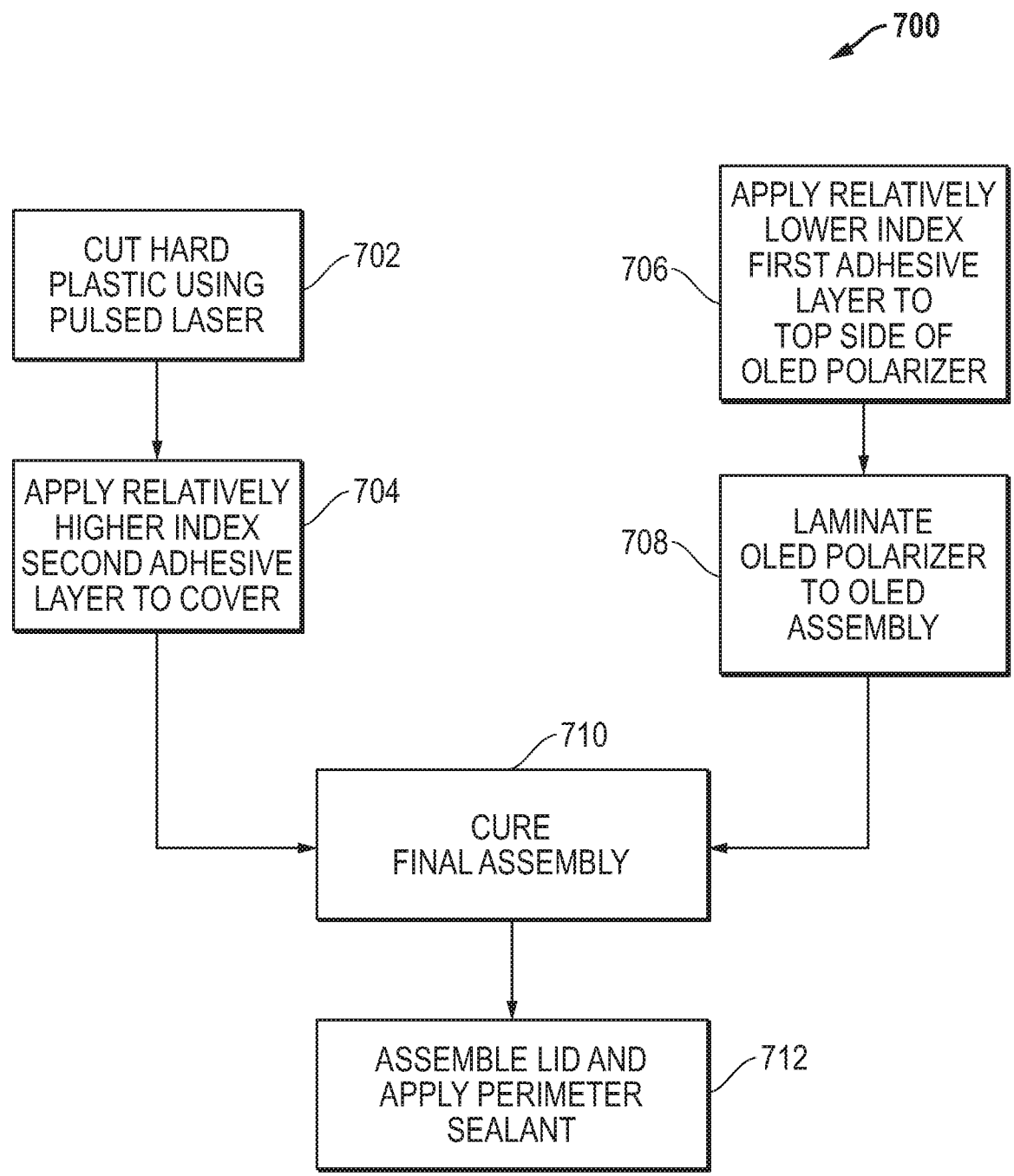
FIG. 7 illustrates methodology according to one exemplary embodiment of the disclosed apparatus and methods.

FIG. 7 illustrates an exemplary embodiment of a methodology 700 that may be employed to laminate components of an OLED-based display assembly apparatus 200 having a first adhesive layer 104 and second adhesive layer 106 that have different indices of refraction from each other in the manner described above in relation to Table 3 and FIGS. 2-3. As shown, methodology 700 begins in step 702 where cover 108 is cut to size (e.g., using a pulsed laser) and prepared for assembly to other components of display assembly apparatus 200. In step 704, second adhesive layer 106 is applied to the inside (e.g., bottom side) surface of cover 108, e.g., by application method such as spray or brush-on of liquid adhesive, or cut and place of tape adhesive. In separate step 706, first adhesive layer 106 is applied to outside (e.g., top side) surface of display substrate 102, e.g., by application method such as spray or brush-on of liquid adhesive, or cut and place of tape adhesive. Then, in step 708 the cover 108 is assembled and laminated to the display substrate 102 with the adhesive layers 104 and 106 therebetween and contacting each other as shown in FIG. 3. The first and second adhesive layers 104 and 106 may then be cured together in step 710 using a final UV or visible light wavelength cure or using other appropriate curing conditions (e.g., as described elsewhere herein) for both adhesive layers 104 and 106. Lid 110 may be assembled in step 712 to the other components of display apparatus assembly 200 as shown in FIGS. 2-3, and perimeter sealant 302 applied and cured or allowed to cure.

It will be understood that the methodologies of FIGS. 5, 6 and 7 are exemplary only, and that any other combination of reordered, additional, fewer and/or alternative steps may be employed to laminate components of a display assembly apparatus 200 that includes a first adhesive layer 104 and second adhesive layer 106 that have different adhesive activation mechanisms and/or different debonding characteristics from each other, to laminate components of a display assembly apparatus 200 that includes a first adhesive layer 104 and second adhesive layer 106 that have different indices of refraction from each other, and to delaminate and replace a cover 108 of a display assembly apparatus 200 that includes a first adhesive layer 104 and second adhesive layer 106 that have different adhesive activation mechanisms and/or different debonding characteristics from each other.

For purposes of this disclosure, an information handling system may include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an information handling system may be a personal computer (e.g., desktop or laptop), tablet computer, mobile device (e.g., personal digital assistant (PDA) or smart phone), server (e.g., blade server or rack server), a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, touch screen and/or a video display. The information handling system may also include one or more buses operable to transmit communications between the various hardware components.

While the invention may be adaptable to various modifications and alternative forms, specific embodiments have been shown by way of example and described herein. However, it should be understood that the invention is not intended to be limited to the particular forms disclosed. Rather, the invention is to cover all modifications, equivalents, and alternatives falling within the spirit and scope of the invention as defined by the appended claims. Moreover, the different aspects of the disclosed apparatus and methods may be utilized in various combinations and/or independently. Thus the invention is not limited to only those combinations shown herein, but rather may include other combinations.

What is claimed is:

1. An apparatus, comprising: a display device having perimeter edges and opposite planar first and second sides, the display device being configured to generate an image through at least the planar first side of the display device; and a transparent cover bonded to the planar first side of the display device by multiple different transparent adhesive layers disposed between the transparent cover and the planar first side of the display device, the multiple transparent adhesive layers comprising a planar first transparent adhesive layer bonded to the planar first side of the display device and a second transparent adhesive layer bonded to the transparent cover such that the planar first transparent adhesive layer is disposed between the planar first side of the display device and the second transparent adhesive layer, the planar first transparent adhesive layer terminating at the perimeter edges of the display device and not contacting any of the perimeter edges of the display device; where the display device generates and displays images to a user through the multiple different transparent adhesive layers and the transparent cover; where the planar first transparent adhesive layer has opposing first and second sides, the first side of the planar first transparent adhesive layer being is bonded in contact with the second transparent adhesive layer, and the second side of the planar first transparent adhesive layer being bonded only in direct contact with the planar first side of the display device; and where the planar first transparent adhesive layer has debonding characteristics that are different from debonding characteristics of the second transparent adhesive layer and/or where the second transparent adhesive layer has an index of refraction that is higher than the index of refraction of the planar first transparent adhesive layer.

2. The apparatus of claim 1, where the display device comprises an organic light emitting diode (OLED) device.

3. The apparatus of claim 1, where the planar first transparent adhesive layer has debonding characteristics that are different from debonding characteristics of the second transparent adhesive layer, the second transparent adhesive layer debonding from at least one of the transparent cover or the planar first transparent adhesive layer without the planar first transparent adhesive layer debonding from the display device.

4. The apparatus of claim 3, where the planar first transparent adhesive layer has a debonding temperature that is greater than a debonding temperature of the second cured transparent adhesive layer with the same level of force applied to separate the transparent cover from the display device.

5. The apparatus of claim 4, where each of the planar first transparent adhesive layer and the second transparent adhesive layer are thermoplastic adhesives.

6. The apparatus of claim 1, where the planar first transparent adhesive layer is a cured thermoset adhesive; and where the second transparent adhesive layer is a thermoplastic adhesive.

7. The apparatus of claim 1, where the second transparent adhesive layer has an index of refraction that is higher than the index of refraction of the planar first transparent adhesive layer; and where the second transparent adhesive layer has an index of refraction that is lower than the index of refraction of the transparent cover.

8. The apparatus of claim 1, where the planar first transparent adhesive layer has debonding characteristics that are different from debonding characteristics of the second transparent adhesive layer; and where the second transparent adhesive layer has an index of refraction that is higher than the index of refraction of the planar first transparent adhesive layer.

9. The apparatus of claim 8, where the planar first transparent adhesive layer is a cured thermoset adhesive; and where the second transparent adhesive layer is a thermoplastic adhesive.

10. The apparatus of claim 1, where the apparatus comprises an information handling system including a display assembly that includes the display device and a first side of the transparent cover bonded to the planar first side of the display device by the multiple different transparent adhesive layers disposed between the first side of the transparent cover and the planar first side of the display device with a second side of the transparent cover that is opposite to the first side of the transparent cover facing outward to form an outer front display surface of the information handling system; and where the apparatus further comprises a lid disposed adjacent the second side of the display device with the display device disposed and contained between the lid and transparent cover.

11. The apparatus of claim 10, where the apparatus comprises a portable information handling system.

12. An apparatus, comprising: a display device having opposite first and second sides, the display device being configured to generate an image through at least the first side of the display device; and a transparent cover bonded to the first side of the display device by multiple different transparent adhesive layers disposed between the transparent cover and the first side of the display device, the multiple transparent adhesive layers comprising a first transparent adhesive layer bonded to the first side of the display device and a second transparent adhesive layer bonded to the transparent cover; where the first transparent adhesive layer has debonding characteristics that are different from debonding characteristics of the second transparent adhesive layer and/or where the second transparent adhesive layer has an index of refraction that is higher than the index of refraction of the first transparent adhesive layer; where the first transparent adhesive layer is bonded in contact with the second transparent adhesive layer; and where transparent graphene particles are dispersed in the second transparent adhesive layer.

13. The apparatus of claim 1, where the display device comprises:
an organic stack layer disposed between a cathode layer and transparent anode layer;
where the anode layer has opposing planar inner and outer sides, the planar inner side of the anode layer facing the organic stack and the planar outer side of the anode layer facing away from the organic stack;
where the cathode layer has opposing planar inner and outer sides, the planar inner side of the cathode layer facing the organic stack and the planar outer side of the cathode layer facing away from the organic stack; and
where the second side of the planar first transparent adhesive layer is bonded only in contact with the planar outer side of the anode layer or is bonded only in contact with the planar outer side of the cathode layer.

14. The apparatus of claim 1, where the display device comprises a light emitting diode (LED) device, organic light emitting diode (OLED) device, transparent organic light-emitting diode (TOLED) device, or liquid crystal display (LCD) device.

15. The apparatus of claim 1, where the planar first transparent adhesive layer is a urethane adhesive, and the second transparent adhesive layer is an acrylate adhesive.

16. The apparatus of claim 1, where each of the planar first transparent adhesive layer and second transparent adhesive layer is one of an acrylate silicone, epoxy, urethane, acrylate, or cyanoacrylate adhesive.

17. The apparatus of claim 1, where the display device is configured to generate and display the image through the planar first side of the display device, the planar first transparent adhesive layer, the second transparent adhesive layer, and the transparent cover.

18. The apparatus of claim 10, where the lid is opaque.

19. The apparatus of claim 1, where the planar first transparent adhesive layer is tape.

20. The apparatus of claim 1, where transparent graphene particles are dispersed in the second transparent adhesive layer.

21. A method, comprising: bonding a transparent cover to a planar first side of a display device that has perimeter edges using multiple different transparent adhesive layers disposed between the transparent cover and the planar first side of the display device, the multiple transparent adhesive layers comprising a planar first transparent adhesive layer bonded to the planar first side of the display device and a second transparent adhesive layer bonded to the transparent cover such that the planar first transparent adhesive layer is disposed between the planar first side of the display device and the second transparent adhesive layer, the planar first transparent adhesive layer terminating at the perimeter edges of the display device and not contacting any of the perimeter edges of the display device; and where the planar first transparent adhesive layer has debonding characteristics that are different from debonding characteristics of the second transparent adhesive layer and/or where the second transparent adhesive layer has an index of refraction that is higher than the index of refraction of the planar first transparent adhesive layer; where the display device has opposite planar first and second sides, the display device being configured to generate an image through at least the planar first side of the display device; where the display device generates and displays images to a user through the multiple different transparent adhesive layers and the transparent cover; and where the planar first transparent adhesive layer has opposing first and second sides, the first side of the planar first transparent adhesive layer being is bonded in contact with the second transparent adhesive layer, and the second side of the planar first transparent adhesive layer being bonded only in direct contact with the planar first side of the display device.

22. The method of claim 21, where the planar first transparent adhesive layer has debonding characteristics that are different from debonding characteristics of the second transparent adhesive layer, the second transparent adhesive layer debonding from at least one of the transparent cover or the planar first transparent adhesive layer without the planar first adhesive layer debonding from the display device.

23. The method of claim 21, where the second transparent adhesive layer has an index of refraction that is higher than the index of refraction of the planar first transparent adhesive layer.

24. The method of claim 21, where the planar first transparent adhesive layer has debonding characteristics that are different from debonding characteristics of the second transparent adhesive layer; and where the second transparent adhesive layer has an index of refraction that is higher than the index of refraction of the planar first transparent adhesive layer.

25. A method, comprising delaminating a first transparent cover from a planar first side of a display device having perimeter edges by: selectively debonding a second transparent adhesive layer that is bonded between the first transparent cover and a planar first transparent adhesive layer that is bonded to the planar first side of the display device without debonding the first transparent adhesive layer from the planar first side of the display device; and then separating the first transparent cover from the planar first side of the display device; where the display device has opposite planar first and second sides, the display device being configured to generate an image through at least the planar first side of the display device; where the display device generates and displays images to a user through the multiple different transparent adhesive layers and the transparent cover; where the transparent cover is bonded to the planar first side of the display device by multiple different transparent adhesive layers disposed between the transparent cover and the planar first side of the display device, the multiple transparent adhesive layers comprising the planar first transparent adhesive layer bonded to the first side of the display device and the second transparent adhesive layer bonded to the transparent cover such that the planar first transparent adhesive layer is disposed between the planar first side of the display device and the second transparent adhesive layer, the planar first transparent adhesive layer terminating at the perimeter edges of the display device and not contacting any of the perimeter edges of the display deice; where the planar first transparent adhesive layer has opposing first and second sides, the first side of the planar first transparent adhesive layer being is bonded in contact with the second transparent adhesive layer, and the second side of the planar first transparent adhesive layer being bonded only in direct contact with the planar first side of the display device; and where the planar first transparent adhesive layer has debonding characteristics that are different from debonding characteristics of the second transparent adhesive layer and/or where the second transparent adhesive layer has an index of refraction that is higher than the index of refraction of the planar first transparent adhesive layer.

26. The method of claim 25, where the planar first transparent adhesive layer has a debonding temperature that is greater than a debonding temperature of the second transparent adhesive layer; and where the step of selectively debonding the second transparent adhesive layer comprises applying a force to separate the transparent cover from the display device while heating the second transparent adhesive layer to a temperature that is less than the debonding temperature of the planar first transparent adhesive layer and that is greater than or equal to the debonding temperature of the second transparent adhesive layer.

27. The method of claim 26, where each of the planar first transparent adhesive layer and second transparent adhesive layer are thermoplastic adhesives.

28. The method of claim 25, where the planar first transparent adhesive layer is a cured thermoset adhesive; and where the second transparent adhesive layer is a thermoplastic adhesive.

29. The method of claim 25, further comprising performing the following steps after the step of separating the first transparent cover from the planar first side of the display device:
  disposing a second and different transparent cover adjacent the planar first side of the display device with the planar first transparent adhesive layer bonded to the display device and a second transparent adhesive layer disposed on the second transparent cover between the second transparent cover and the planar first side of the display device; and
  bonding the second transparent cover to the planar first side of the display device by curing the second transparent adhesive layer between the first transparent cover and the planar first transparent adhesive layer without debonding the planar first transparent adhesive layer.

* * * * *